United States Patent [19]

Dijkstra et al.

[11] 3,890,153

[45] June 17, 1975

[54] POSITIVE-ACTING NAPTHOQUINONE DIAZIDE PHOTOSENSITIVE COMPOSITION

[75] Inventors: Rinse Dijkstra; Arnoldus Johannes Maria Van den Broek, both of Emmasingel, Eindhoven, Netherlands

[73] Assignee: U.S. Philips Corporation, New York, N.Y.

[22] Filed: Dec. 6, 1973

[21] Appl. No.: 422,585

Related U.S. Application Data

[63] Continuation of Ser. No. 233,760, March 10, 1972, abandoned.

[30] Foreign Application Priority Data

Mar. 13, 1971 Netherlands....................... 7103379

[52] U.S. Cl........................ 96/91 D; 96/36.2; 96/67; 96/75; 96/36

[51] Int. Cl......................... G03f 7/08; G03c 1/54

[58] Field of Search........... 96/91 D, 75, 115 R, 33, 96/36, 36.3

[56] References Cited

UNITED STATES PATENTS

| | | | |
|---|---|---|---|
| 3,396,019 | 8/1968 | Uhlig | 96/75 X |
| 3,495,979 | 2/1970 | Laridon et al. | 96/91 D X |
| 3,498,786 | 3/1970 | Notley et al. | 96/75 X |
| 3,502,470 | 3/1970 | Delzenne et al. | 96/115 R X |
| 3,522,049 | 7/1970 | Poot et al. | 96/115 R X |
| 3,551,154 | 12/1970 | Di Blas et al. | 96/91 D |
| 3,622,333 | 11/1971 | Cope | 96/91 D X |
| 3,634,082 | 1/1972 | Christensen | 96/91 D X |
| 3,637,384 | 1/1972 | Deutsch et al. | 96/91 D X |
| 3,660,097 | 5/1972 | Mainthin | 96/91 D |
| 3,679,419 | 7/1972 | Gillich | 96/75 |

OTHER PUBLICATIONS

Abstracts of Photographic Science & Engineering, No. 3755–72P, 5/1972.

Abstracts of Photographic Science & Engineering, No. 6577–72P, 8/1972.

Abstracts of Photographic Science & Engineering, No. 8359–72P, 10/1972.

*Primary Examiner*—Charles L. Bowers, Jr.
*Attorney, Agent, or Firm*—Frank R. Trifari; Norman N. Spain

[57] ABSTRACT

Positive-acting photosensitive compositions having satisfactory adherence to metals, glass, silicon oxide and the like are obtainable by dissolving a naphthoquinone-(1,2)-diazide-(2) and a polyvalent alcohol partially esterfied with a hydroxyphenylmonocarboxylic acid, which ester has a softening point between 50°C and 95°C, in an organic solvent. After a substrate has been coated with the composition the assembly is heated at from 80°C to 95°C before the exposure. The compositions provide well-defined images.

4 Claims, No Drawings

POSITIVE-ACTING NAPTHOQUINONE DIAZIDE PHOTOSENSITIVE COMPOSITION

This is a continuation of application Ser. No. 233,760, filed Mar. 10, 1972 now abandoned.

The invention relates to a positive-acting photosensitive composition which contains a solution of a naphthoquinone(1,2)-diazide-(2) and a film-forming resin in an organic solvent.

Published German Patent Specification No. 1,195,166 described positive-acting photosensitive compositions which contain a naphthoquinone-(1,2)-diazido-(2)-sulphonic acid ester as the photosensitive substance and a Novolak, i.e. a non-curable condensation product of a phenol and a formaldehyde which is resistant to acids and is soluble in alkalis, as the film-forming resin.

The composition when applied to a metal substrate, exposed through a mask and developed with an alkaline solution can form a positive image of a mask on the substrate. The image may be transferred to the substrate by attacking the non-coated parts of the substrate with etchants.

These known compositions provide satisfactory adherence to metals. Adherence to non-metallic surfaces, such as glass and silicon oxide, however is less satisfactory. Consequently when after exposure and development of the image the substrate is subjected to an etching treatment the etchant penetrates between the substrate surface and the protective photosensitive layer, where it also attacks the substrate, which effect is generally referred to as underetching. Thus, the substrate is etched not only according to the desired pattern but also beyond this pattern. As a result, the etched image is greater than the desired image and moreover its shape is not identical with the desired one. The etched image is poorly defined.

In practice attempts are made to restrict the underetching by using a heat treatment at about 120°C after exposure and development. This actually improves the protective action of the coating against etchants, but it involves another impairment of the desired image. At the said temperature the protective layer will flow slightly, with a consequent reduction of the definition of the image. In addition the photosensitive naphthoquinone-diazides decompose with the evolution of gas, which gives rise to pinholes in the protective layer. As a result, during the etching process the substrate will be attacked at points which have not been exposed, and this effect also is highly undesirable.

The invention provides a positive-acting photosensitive composition which enables a particularly satisfactory adherence not only to metals but also to other materials, such as glass, silicon oxide and the like, to be obtained. The composition provides well-defined images and a much slighter pinhole density.

The positive-acting photosensitive composition according to the invention contains a solution of a naphthoquinone(1,2)-diazido-(2) and a film-forming resin in an organic solvent and is characterized in that the film-forming resin is a polyvalent alcohol which has been partially esterified with a hydroxyphenylmonocarboxylic acid and has a softening point between 50°C and 95°C.

Such resins may, for example, be obtained by partial esterification of at least one polyvalent epoxide, at least one polyvalent alcohol or mixtures thereof by means of a hydroxyphenylmonocarboxylic acid. Examples of suitable carboxylic acids are: 4-hydroxybenzoic acid, 3-methyl-4-hydroxybenzoic acid, 3,5-dimethyl-4-hydroxybenzoic acid, γ, γ-di-(p-hydroxyphenyl) valeric acid, gallic acid and the like. Examples of suitable polyepoxides are: diglycidylethers of 2,2-di(p-hydroxyphenyl)propane and di(p-hydroxyphenyl)-methane, vinyl-cyclohexene-3-diepoxide, 3,4-epoxycyclohexylmethyl-3,4-epoxycyclohexane carboxylate and the like. Examples of suitable polyalcohols are: 1, 1, 1-trihydroxymethylpropane and pentaerythritol.

Preferably polyvalent alcohols esterified to from 40% to 60% are used. They are obtainable, for example, by reacting 1 equivalent of the epoxy compound and from 0.8 to 2.2 equivalents of the acid. If more than 1.2 equivalents of the acid are used, the reaction must prematurally be stopped. The degree of esterification can be ascertained from the amount of water of reaction distilled off. The use of an excess of acid has the sole purpose of accelerating the reaction.

Known naphthoquinone-(1,2)-diazido-(2)-sulfonic-acid and carboxylic-acid esters and amides may be sused as the photosensitive substances, for example the compounds described in German Patent Specification Nos. 854,890, 865,109, 938,233, 1,109,521, 1,114,705, 1,118,606 and 1,120,273, the German Published Patent Application No. 1,195,166 and the U.S. Patent No. 3,402,044.

Solvents suitable for use in the composition are: ketones, such as acetone, cyclopentanone, cyclohexanone, methylethylketone, diacetone alcohol, ethers such as glycolmonomethylether, glycolmonoethylether, dioxane, esters such as methoxyethylacetate, ethylacetate, butylacetate, and mixtures of these and other solvents. These solvents may be diluted with hydrocarbons such as, for example, xylene or dipolarly aprotic solvents, such as dimethylformamide, dimethylacetamide, N-methylpyrrolidone, and the like.

In the photosensitive composition according to the invention the ratio between the amounts by weight of the photosensitive substance and the resin as a rule ranges from 1/1 to 1/6 and preferably from 1/2 to 1/3.

The composition contains an amount of a solvent such as to yield layers of the desired thickness by means of the application technique selected. When the composition is spread over the substrate by centrifuging, as a rule a composition is used which has a solid content of from 10 to 30 percent by weight.

After the composition has been applied to the substrate and the photosensitive layer has been dried, the assembly is subjected to a heat treatment. Only then does the exposure take place. The advantage of this order of succession is that the image has not yet been formed when the heat treatment is effected, so that the ensuing flow cannot disturb the image. In general a treatment during from 20 to 30 minutes at from 80° to 95°C is sufficient. However, the temperature must not be raised any further, since otherwise the photosensitive substances will decompose.

Layers obtained with the photosensitive composition according to the invention are resistant to acid solutions but soluble in strongly basic solutions. However, when exposed the composition is more readily soluble than when unexposed. This permits latent images to be developed with the use of an aqueous solution of a base having a pH of about 12 to 13. The protective layer may be removed from a substrate by washing with the solvents which can be used in the composition.

The invention will be explained more fully by the following detailed description.

Resins were prepared which may be used in compositions according to the invention, but also a cresolformaldehyde resin was prepared whicn, just as a commercially available cresolformaldehyde resin, was used in compositions containing the same photosensitive substance, permitting a comparison between the properties of the known compositions and the novel compositions.

RESIN 1

19.1 g (≈ 0.1 g-eq.) of diglycidylether of 2,2-di(p.hydroxyphenyl)propane and 60.0 g (≈ 0.21 g mol) γ, γ-di(p.hydroxyphenyl)valeric acid were heated, with the passage of argon, to 200°C in about 30 minutes and maintained at this temperature for 4.5 hours. The water of reaction was continuously distilled off. The reaction product was then cooled and dissolved in acetone to form a 40% by weight solution. This was added drop by drop with stirring to 30 volumes of water, whereupon the pH value of the mixture was set to from 8 to 8.5 by means of concentrated sodiumcarbonate. The precipitated resin powder was drawn off, washed with water and dried in a vacuum at 50°C.

Melting range 75°C – 85°C.

RESIN 2

25.1 g (≈ 0.13 g-eq.) of diglycidylether of 2,2-di(p.hydroxyphenyl)propane and 62,4 g (≈ 0.21 g-mol) of γ, γ-di(p.hydroxyphenyl)valeric acid were reacted and the reaction product was worked up in the manner described in 1).

Sintering point 80°C. Melting range 85°C – 95°C.

RESIN 3

44.5 g (≈ 0.25 g-eq.) of diglycidylether of 2,2-di(p-hydroxyphenyl)propane, 57.2 gram (≈ 0.20 g-mol) of γ, γ -di(p.hydroxyphenyl) valeric acid and 200 gram of cyclohexanone were heated, whilst passing through nitrogen and distilling off the cyclohexanone, to 195°C in about 45 minutes and then maintained at this temperature for 4.5 hours. After cooling, a 30% by weight ethanolic solution was made which was added drop by drop with stirring to 30 volumes of water. The precipitated powder was drawn off, washed with water and dried in a vacuum at 50°C. Melting range from 75°C to 85°C. Sintering point about 70°C.

RESIN 4

18.5 g (≈ 0.25 g-eq.) of vinylcyclohexene-3-dioxide, 82.4 g (=0.288 g-mol) of γ, γ-di(p-hydroxyphenyl) valeric acid, 2.3 gram of triethylamine and 200 gram of cyclohexanone were heated, whilst passing through nitrogen and distilling off the cyclohexanone, to 190°C in about 45 minutes and then maintained at this temperature for 5 hours. The reaction product was cooled and then dissolved in 200 gram of ethanol, after which the solution was added drop by drop with stirring to 7 litres of water. The pH value was set to from 8 to 8.5 by means of a sodiumcarbonate solution. The precipitated powder was drawn off, washed with water, dried and then dissolved in 150g of acetone. The solution was added drop by drop with stirring to 7 litres of pure water, the precipitated powder was drawn off, washed with water and dried in a vacuum at 50°C. Melting range 85°C – 94°C.

Sintering point ≈ 82°C.

RESIN 5

28 g (≈ 0.2 g eq.) of 3,4,3′,4′-diepoxycyclohexylmethylcyclohexylcarboxylate, 57.2 g (= 0.2 g-mol) of γ, γ -di(p-hydroxyphenyl)valeric acid and 200 g of cyclohexanone were heated, whilst passing through nitrogen and distilling off the cyclohexanone, to 190°C in about 45 minutes and then maintained at this temperature for 5 hours. The reaction product was dissolved in 150 gram of acetone, whereupon the solution was added drop by drop with stirring to 7.5 litres of water. The precipitated powder was drawn off, washed with water and dried in a vacuum at 60°C.

Sintering point 80°C; melting range 83°C – 93°C.

RESIN 6

42.7 g (≈ 0.24 g-eq.) of diglycidylether of 2,2-di(p.hydroxyphenyl)-propane, 49.0 g (=0.288 g-mol) of anhydrous gallic acid and 200 gram of cyclohexanone were heated, whilst passing through argon, at 160°C until a homogeneous solution was produced. Then, whilst distilling off, the temperature of the cyclohexanone was raised to 195°C and subsequently the temperature was maintained at from 195°C to 205°C for 5 hours. A 33 percent by weight ethanolic solution of the reaction product was made and added drop by drop with stirring to 7.5 litres of water. The precipitate was drawn off, washed with water, dried and then dissolved in 150 g of acetone. This solution was added drop by drop whilst stirring to 7.5 litres of water, the precipitated resin powder was drawn off, washed with water and dried in a vacuum at 50°C. Sintering point 75°C, melting range from 78°C to 85°C.

RESIN 7

47.2 g (≈ 0.26 g-eq.) of diglycidylether of 2,2-di(p.hydroxyphenyl)propane, 46.2 gram (≈ 0.2 g-mol) of 3,5-dihydroxybenzoic acid and 200 g of cyclohexanone were heated at about 170°C, whilst passing through nitrogen, until a homogeneous mixture was produced. Whilst the cyclohexanone was distilled off the reaction temperature was raised to about 195°C – 200°C, and this temperature was maintained for 5 hours. After cooling, a 30 percent by weight solution of the resin in diethylether was made. The solution was washed with a 5 percent by weight sodiumcarbonate solution and with water and then dried over $Na_2SO_4$ and evaporated to dryness. The residue was dissolved in a 3-fold amount of acetone and this solution was added whilst stirring drop by drop to 30 volumes of water. The precipitated powder was filtered off, washed with water and dried in a vacuum at 50°C. Melting range 76°C – 84°C.

RESIN 8.

47.2 g (≈ 0.26 g-eq.) of diglycidylether of 2,2-di(p.hydroxyphenyl)propane, 44.7 g (≈ 0.29 g-mol) of 2,4-dihydroxybenzoic acid and 200 g of cyclohexanone were reacted in the manner described at 6. A 30 percent by weight acetonic solution of the reaction product was prepared and added whilst stirring to a mixture of 800 ml of acetone and 1.5 litres of water the pH value of which had been brought to 13 by means of KOH. The addition of 2.5 litres of water produced a precipitate which was washed with water and then dissolved in 150 g of acetone. The solution was added drop by drop whilst stirring to 7 litres of water. The precipitated resin was filtered off, washed with water and dried in a vacuum at 50°C. Melting range 75°C – 85°C.

RESIN 9

44.5 g (≈ 0.25 g-eq) of diglycidylether of 2,2-di-(p.hydroxyphenyl)propane, 49.8 g (≈ 0.30 g-mol) of 3,5-dimethyl-4-hydroxybenzoic acid, 2 g of triethylamine and 200 g of cyclohexanone were heated at 190°C whilst passing through nitrogen and distilling off the cyclohexanone in about 1 hour and then held at this temperature for 4 hours. After cooling, the reaction product was dissolved in 200 g of ethanol. The solution was added drop by drop whilst stirring to a solution of 10 gram of $Na_2CO_3$ in 7 litres of water. The precipitate was drawn off, washed with water, dried and then dissolved in a mixture of 150 g of ethanol and 2 ml of concentrated hydrochloric acid. The solution was added drop by drop with stirring to 7 litres of water. The precipitate was filtered off, washed with water and dried in a vacuum at 50°C. Sintering point 70°C, melting range 75°C – 84°C.

72 parts by weight of cyclopentanone or methoxyethylacetate were mixed until a homogeneous solution was obtained.

By means of a centrifuge the solution was uniformly distributed over the surface of a slice of silicon which had thermally been provided with a layer of silicon dioxide about 0.3 μm thick. The number of revolutions of the centrifuge was between 4,000 and 5,000 per minute. After the solvent had evaporated, the coated substrate was heated at 95°C for 30 minutes. The thickness of the coating then was 0.8 ± 0.1 μm.

A mask consisting of a plate of glass partially covered with chromium was then brought into contact with the coating. The coating was exposed through the mask by a Philips SP 500-watt water-cooled mercury-vapour discharge lamp placed at a distance of 40 cm for 25 seconds.

Then the latent image was developed at 23°C with an aqueous solution of KOH, washed with water and dried at 50°C. The resulting partially coated substrate was etched with a solution containing 39 g of ammoniumfluoride, 13 g of 40 percent by weight hydrofluoric acid and 52 g of water for 10 minutes.

The underetching of windows of 7.5 × 7.5 μm was then measured by means of a microscope. The results are listed in the following Table.

TABLE

| Resin | Melting range | pH of the developer | Developing time | Underetching | Underetching corrected |
|---|---|---|---|---|---|
| 1 | 75 – 85°C | 12.8 | 25 sec. | ~0.6 μm | ~0.3 μm |
| 2 | 85 – 95°C | 12.8 | 35 sec. | ~.0 μm | ~0.7 μm |
| 3 | 75 – 85°C | 13.0 | 25 sec. | ~0.5 μm | ~0.2 μm |
| 4 | 85 – 94°C | 12.2 | 30 sec. | ~0.75 μm | ~0.5 μm |
| 5 | 83 – 93°C | 12.3 | 35 sec. | ~0.8 μm | ~0.5 μm |
| 6 | 78 – 85°C | 11.8 | 25 sec. | ~0.5 μm | ~0.2 μm |
| 7 | 76 – 84°C | 12.1 | 30 sec. | ~0.75 μm | ~0.5 μm |
| 8 | 75 – 85°C | 13.0 | 30 sec. | ~0.7 μm | ~0.4 μm |
| 9 | 75 – 84°C | 12.2 | 25 sec. | ~0.6 μm | ~0.3 μm |
| A | 55 – 65°C | 12.5 | 25 sec. | 3–4 μm | 2.7–3.7 μm |
| B | 108 – 116°C | 12.9 | 30 sec. | ~2.0 μm | ~1.7 μm |

RESIN A 108.1 g (1.0 g-mol) of distilled o-cresol, 68.9 g of formalin, which contained 0.85 g-mol of formaldehyde, and 1.8 g of crystallized oxalic acid were boiled at a reflux cooler for 4.5 hour. The volatile constituents were distilled off at 150°C, first at normal pressure and then at a pressure of 10 mm of Hg. The residue was a resin which was solid at room temperature and which for purification was dissolved in 250 g of ethanol. The solution was added drop by drop whilst stirring to 7 litres of water which had a temperature of 5°C. The precipitated powder was filtered off, washed with water and dried in a vacuum at 40°C.

Melting range 55°C – 65°C.

RESIN B

Alnovol 429 K, a Novolak on the basis of m-cresol and formaldehyde, obtained from Chemische Werke Albert, Wiesbaden, German Federal Republic.

EXAMPLE 8 parts by weight of naphtoquinone-(1,2)-diazido-(2)-5-(3'-hydroxy-4'-benzoylphenylsulphonate), 20 parts by weight of one of the resins 1 to 9, A and B, and When evaluating these results it should be borne in mind that the etched area always is greater than the non-coated area. When using an ideal coating which admits no etching liquid at all between the coating and the substrate surface, the etching liquid initially acts exclusively in a direction at right angles to the substrate surface. Once the etching liquid has penetrated into the substrate, the liquid also acts laterally in directions parallel to the substrate surface, so that the etched area increases. It is assumed that the lateral etching rate is 7/10 of the rate in the direction at right angles to the surface. In the above-described tests the latter rate was 0.4μ/10 minutes, so that the lateral etching was about 0.28μm. The corrected values of the underetching as defined at the beginning of this specification have been given in the last column of the Table.

The results show that with the compositions according to the invention considerably better results are obtainable than with compositions as described in German Published Specification No. 1,195,166, whilst retaining a satisfactory definition.

What is claimed is:

1. A positive-acting photosensitive composition comprising a solution in admixture of a naphthoquinone-(1,2)-diazido-(2) and a film forming polyvalent alcohol resin in admixture in an organic solvent, said film-forming resin having a softening point between 50°C and 95°C and being obtained by the esterification of 40% to 60% of groups available for esterification of a polyvalent epoxide compound with a hydroxy-phenyl-monocarboxylic acid.

2. The composition of claim 1 wherein the weight ratio between the naphthoquinone and the resin is from 1:1 to 1:6.

3. The composition of claim 1 wherein the solid content is from 10 to 30% by weight.

4. Composition as claimed in claim 2, characterized in that the weight ratio between the napthoquinone and the resin is from 1:2 to 1:3.

* * * * *